(12) United States Patent
Kim (10) Patent No.: US 9,698,142 B2
(45) Date of Patent: Jul. 4, 2017

(54) SEMICONDUCTOR DEVICE AND METHOD FOR FORMING THE SAME

(71) Applicant: SK HYNIX INC., Icheon (KR)

(72) Inventor: Jung Sam Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 478 days.

(21) Appl. No.: 14/181,039

(22) Filed: Feb. 14, 2014

(65) Prior Publication Data

US 2014/0332872 A1    Nov. 13, 2014

(30) Foreign Application Priority Data

May 13, 2013    (KR) .................. 10-2013-0053895

(51) Int. Cl.
*H01L 27/07* (2006.01)
*H01L 27/06* (2006.01)

(52) U.S. Cl.
CPC ...... *H01L 27/0733* (2013.01); *H01L 27/0629* (2013.01)

(58) Field of Classification Search
CPC .................. H01L 27/0733; H01L 27/0629
USPC .............. 257/212, 296, 532, 686, 738, 758
See application file for complete search history.

(56) References Cited

U.S. PATENT DOCUMENTS

| 6,207,547 | B1 | 3/2001 | Chittipeddi et al. |
| 2006/0249848 | A1* | 11/2006 | Coolbaugh ............. H01L 24/11 257/758 |
| 2008/0128755 | A1* | 6/2008 | Fukamizu ....... H01L 21/823475 257/203 |
| 2010/0001328 | A1 | 1/2010 | Yang et al. |
| 2010/0219502 | A1* | 9/2010 | Shieh .................. H01L 23/5223 257/532 |
| 2012/0161217 | A1* | 6/2012 | Sato .................. H01L 27/11526 257/296 |
| 2013/0009226 | A1* | 1/2013 | Park .................. H01L 27/10855 257/296 |

FOREIGN PATENT DOCUMENTS

KR    10-2010-0005393 A    1/2010

* cited by examiner

*Primary Examiner* — Errol Fernandes (57) ABSTRACT

A semiconductor device includes a semiconductor substrate including a pad region and a peripheral region, a first buffer layer formed to include a capacitor over the semiconductor substrate in the pad region, a second buffer layer formed to include a first contact pad over the first buffer layer, and a third buffer layer formed to include a second contact pad over the first contact pad. The semiconductor device, by additionally forming a buffer layer at a lower part in the pad region, reduces a stress caused by wire bonding. Thus, an applied stress to a lower structure in the pad region is also reduced. As a result, the buffer layer prevents formation of an electrical bridge between the pad region and the peripheral region.

17 Claims, 8 Drawing Sheets

SEMICONDUCTOR DEVICE AND METHOD FOR FORMING THE SAME

CROSS-REFERENCE TO RELATED APPLICATION

The priority of Korean patent application No. 10-2013-0053895 filed on 13 May 2013, the disclosure of which is incorporated by reference hereby in its entirety, is claimed.

BACKGROUND

Embodiments relate to a semiconductor device and a method for forming the same, and more particularly to a semiconductor device for preventing formation of a crack from in a pad region and a peripheral region of the semiconductor device, and a method for forming the semiconductor device.

Generally, highly-integrated semiconductor devices have been formed by stacking conductive and by interconnecting upper and lower conductive layers.

The number of stacked conductive layers increases in proportion to increasing precision and complexity of the semiconductor devices. If stacking and patterning processes to form a desired number of conductive layers have been carried out, a bonding pad having a multi-layered conductive film is formed.

The bonding pad has a line structure formed over a surface of the integrated circuit and is configured to provide a contact surface between an external pin lead and an internal circuit. A bonding wire provides an electrical connection between the pin and the bonding pad. During attachment of the bonding wire to the bonding pad, one end of the bonding wire is positioned in a certain location of the bonding pad, using a precise position adjustment machine. In the attachment process, a mechanical stress is applied to the location of the bonding pad by the precision position adjustment machine. This stress can in turn be transferred and applied to a MOS capacitor and a specific circuit, both of which are disposed in a lower part of the semiconductor device and configured to reduce noise of the semiconductor device. As a result, a defect (e.g., a crack or void) occurs in the semiconductor device that may result in a micro bridge in the pad region and the peripheral region.

SUMMARY

Various embodiments are directed to providing a semiconductor device and a method for forming the same to address issues of the related arts.

An embodiment relates to a semiconductor device for addressing the above-described issues that a mechanical stress is applied to a bonding pad at a contacting location with a bonding wire may result in a crack in a lower structure of a semiconductor device, so that a micro bridge occurs in the pad region and the peripheral region.

In accordance with an embodiment, a semiconductor device includes: a semiconductor substrate including a pad region and a peripheral region; a first buffer layer formed to include a capacitor over the semiconductor substrate in the pad region; a second buffer layer formed to include a first contact pad over the first buffer layer; and a third buffer layer formed to include a second contact pad over the first contact pad.

The semiconductor device may further include: a metal-oxide-semiconductor (MOS) transistor formed below the first buffer layer, and formed over the semiconductor substrate in the pad region and the peripheral region.

The MOS transistor may include a laminate structure of a polysilicon layer, a metal layer, and a hard mask layer.

The semiconductor device may further include: a first metal line formed over the MOS transistor.

The semiconductor device may further include: a first metal contact formed over the first metal line in the peripheral region.

The first buffer structure may be formed over the first metal line.

The first contact pad may include tungsten.

A top surface of the first contact pad may be formed approximately at a same level as a top surface of the first metal contact.

The semiconductor device may further include: a second metal line formed over the first metal contact in the peripheral region.

The second metal line may include a copper (Cu) line.

The semiconductor device may further include: a second metal contact formed over the second metal line in the peripheral region.

The second contact pad may include tungsten.

A top surface of the second contact pad may be formed approximately at a same level as a top surface of the second metal contact. The first contact pad and the second contact pad may be spaced apart from each other by an insulation film.

The semiconductor device may further include a metal pad formed over the third insulation film in the pad region and the peripheral region.

The metal pad may include aluminum. The semiconductor device may further include: a pad open portion including a portion of the metal pad in the pad region and defined by a passivation layer formed over the metal pad in the peripheral region.

In accordance with an embodiment, a method for forming a semiconductor device includes: forming a first buffer structure including a capacitor over a semiconductor substrate in a pad region, the semiconductor substrate including the pad region and a peripheral region; forming a second buffer layer including a first contact pad over the first buffer layer; and forming a third buffer layer including a second contact pad over the first contact pad.

The method may further include: before forming the first buffer structure, forming a MOS transistor over the semiconductor substrate in the pad region and the peripheral region.

The MOS transistor may include a laminate structure of a polysilicon layer, a metal layer, and a hard mask layer.

The method may further include: forming a first metal line over the MOS transistor.

The forming the first buffer layer may include: forming a storage node; forming a dielectric film over the storage node; and forming an upper electrode over the dielectric film.

The forming the second buffer layer may include: forming a first insulation film over the first buffer layer in the pad region and the peripheral region; forming a first pad trench by etching the first insulation film to expose a portion of the first buffer layer; and forming the first pad contact by forming a barrier metal layer and a conductive material to fill the first pad trench.

The conductive material may include tungsten.

The method may further include: while forming the second buffer layer, forming a first metal contact penetrating the first insulation film over the first metal line in the peripheral region.

The method may further include: forming a second metal line over the first metal contact.

The forming the second metal line may includes: forming a second insulation film over the first insulation film; forming a trench by etching the second insulation film to expose the first metal contact in the peripheral region; and filling a metal layer in the trench.

The forming the third buffer layer may include: forming a third insulation film over the second insulation film; forming a second pad trench by etching the third insulation film to a depth shallower than a thickness of the third insulation film in the pad region; and forming the second pad contact by forming a barrier metal layer and a conductive material to fill the second pad trench.

The conductive material may include tungsten.

The method may further include: while forming the third buffer layer, forming a second metal contact penetrating the third insulation film over the second metal line in the peripheral region.

The method may further include: forming a metal pad over the third insulation film in the pad region and the peripheral region. The metal pad may include aluminum.

The method may further include: after forming of the metal pad, forming a passivation layer over the metal pad; and forming a pad open portion by etching the passivation layer in the pad region to expose the metal pad in the pad region.

It is to be understood that both the foregoing general description and the following detailed description of embodiments are for illustrative purposes and are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts.

Figure 1:
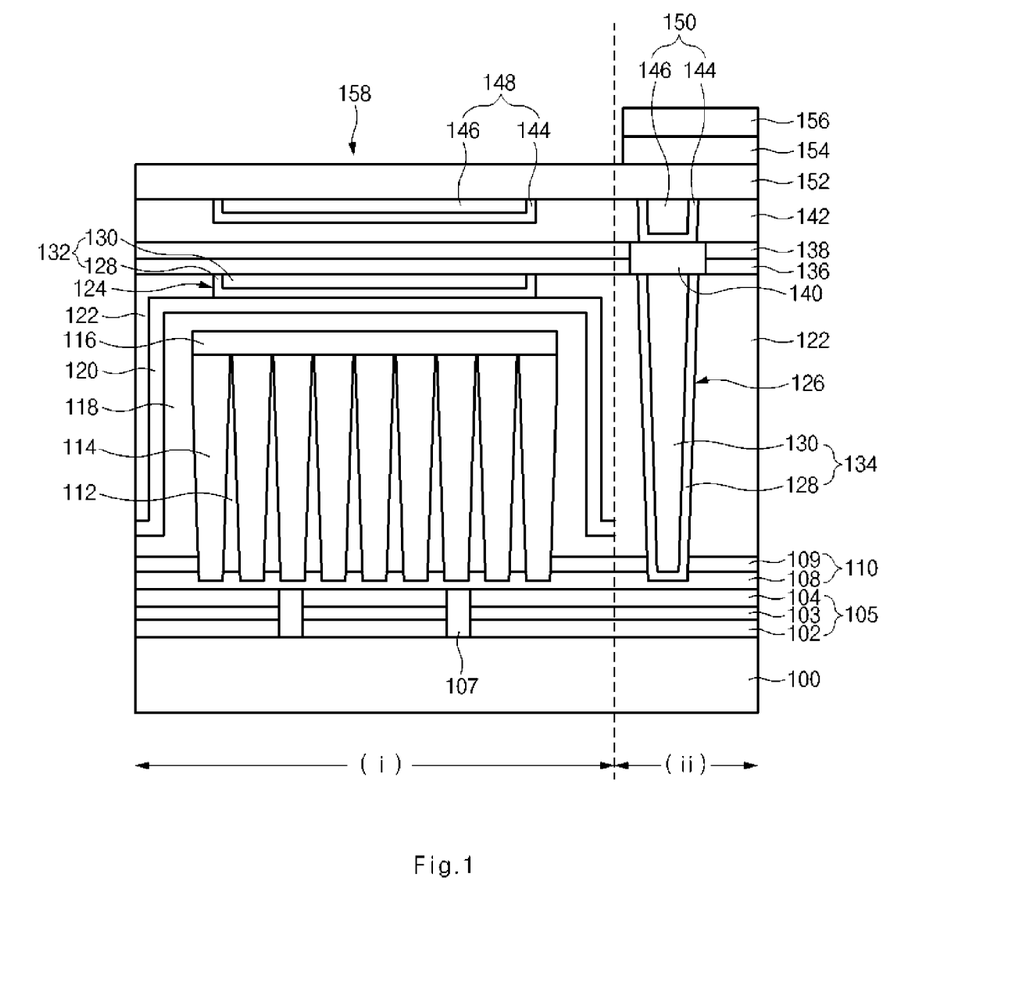
FIG. 1 is a cross-sectional view illustrating a semiconductor device according to an embodiment.

Embodiments of the present invention are described herein with reference to illustrations that are schematic illustrations of embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It will be understood that when an element is referred to as a "layer," the element may be a single layer or the layer may comprise a plurality of layers. It will also be understood that when an element or structure is referred to as being "over" another element, a portion of the structure may be provided over the element, or the entire structure may be provided over the element. FIG. 1 is a cross-sectional view illustrating a semiconductor device according to an embodiment.

Referring to FIG. 1, a semiconductor device according to an embodiment includes a semiconductor substrate 100 including a pad region (i) and a peripheral region (ii), a first buffer layer including a capacitor formed over the semiconductor substrate 100 in the pad region (i), a second buffer layer including a first contact pad 132 formed over the first buffer layer, and a third buffer layer including a second contact pad 148 formed over the first contact pad 132.

The capacitor included in the first buffer layer may have a storage node 114, a dielectric film 118, and an upper electrode 120 in the pad region (i). The capacitor may further include a support film 116 over the storage node 114 to prevent leaning of the storage node 114. The first buffer layer reduces a stress generated when a wire is bonded to a certain position in a pad open portion 158, so that a stress applied to a lower structure in the pad region (i) and the peripheral region (ii) of the semiconductor device is reduced. A MOS transistor 105 may further be formed over the semiconductor substrate 100 in the pad region (i) and the peripheral region (ii), and a metal line 110 may further be formed over the MOS transistor 105. The MOS transistor 105 may be isolated by an insulation film 107. Here, the storage node 114 may be formed over the metal line 110. For example, the MOS transistor 105 may have a laminate structure of a polysilicon layer 102, a metal layer 103, and a hard mask layer 104. In an embodiment, the semiconductor device may further include a first metal contact 134 configured to penetrate an insulation film 122 in the peripheral region (ii). The insulation film 122 may be formed over the metal line 110 in the peripheral region (ii). The insulation film 122 may be formed in the peripheral region (ii) and the pad region (i).

The first contact pad 132 may include a laminate structure of a barrier metal layer 128 and a conductive material 130 at an upper part of the upper electrode 120. The first contact pad 132 may serve as a second buffer layer. The first contact pad 132 reduces a stress generated when a wire is bonded to the pad in the pad open portion 158, so that a stress applied to the lower structure in the pad region (i) and the peripheral region (ii) is reduced. As a result, the first contact pad 132 may prevent forming of an electric bridge between the pad region (i) and the peripheral region (ii). For example, the barrier metal layer 128 may include a titanium (Ti) film or a titanium nitride (TiN) film, and the conductive material 130 may include tungsten (W). In this case, a top surface of the first contact pad 132 may be located approximately at the same level as a top surface of the first metal contact 134. A metal line 140 may be formed over the first metal contact 134 in the peripheral region (ii). For example, the metal line 140 may include a copper (Cu) line. When the metal line 140 is formed by a damascene process, insulation films 136 and 138 may be formed over the insulation film 122 and etched. Then, in the damascene process, the metal line 140 fills the etched portions of the insulation films 136 and 138. In this case, the insulation film 136 may be a nitride film, and the insulation film 138 may be an oxide film. In addition, a second metal contact 150 may further be formed over the metal line 140. For example, the second metal contact 150 may be formed to penetrate the insulation film 142 formed over the insulation film 138, and the insulation film 142 may include a Tetra Ethyl Ortho Silicate (TEOS).

The second contact pad 148 is spaced apart from the first contact pad 132 by the insulation films 136, 138 and 142, and includes a laminate structure of a barrier metal layer 144 and a conductive material 146. The second contact pad 148 may serve as a third buffer layer. Specifically, the second contact pad 148 may reduce a stress generated when a wire is bonded to the pad in the pad open portion 158, so that a stress applied to the lower structure in the pad region (i) and the peripheral region (ii) of the semiconductor device is reduced. As a result, the second contact pad 148 may prevents forming of an electric bridge between the pad region (i) and the peripheral region (ii). For example, the barrier metal layer 144 may include a titanium (Ti) film or a titanium nitride (TiN) film, and the conductive material 146 may include tungsten (W). In this case, a top surface of the second contact pad 148 may be located approximately at the same level as a top surface of the second metal contact 150.

In addition, a metal pad 152 formed over the second contact pad 148 may be included in the pad region (i) and the peripheral region (ii). For example, the metal pad 152 may include aluminum (Al). The pad open portion 158 may be formed by etching passivation layers 154 and 156 formed over the metal pad 152, thereby exposing the metal pad 152 in the pad region (i) and defining the pad open region 158. The remaining passivation layers 154 and 156 may be included in the peripheral region (ii).

The semiconductor device according to this embodiment reduces a stress applied to the lower structure including a lower MOS transistor or a specific circuit in the pad region (i) and the peripheral region (ii). Such reduction in the applied stress may be achieved by using the first buffer layer, the second buffer layer, and the third buffer layer contained in the pad region (i). As a result, these buffer layers may prevent formation of electric bridging between the pad region (i) and the peripheral region (ii). A method for forming the semiconductor device according to an embodiment will hereinafter be described with reference to FIGS. 2a to 2h. FIGS. 2a to 2h are cross-sectional views illustrating a method for forming the semiconductor device according to an embodiment.

Figure 2A:
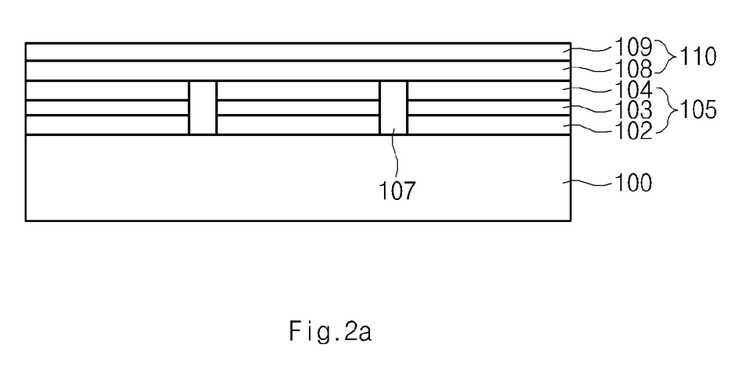
FIGS. 2a to 2h are cross-sectional views illustrating a method for forming the semiconductor device according to an embodiment.

Referring to FIG. 2a, a MOS transistor 105 including a polysilicon layer 102, a metal layer 103, and a hard mask layer 104 is formed over the semiconductor substrate 100 including the pad region and the peripheral region. Although the MOS transistor 105 is formed in both of the pad region and the peripheral region as shown in FIGS. 2c to 2h, the MOS transistor 105 formed in the peripheral region is not shown in FIGS. 2a and 2b for convenience of description and better understanding of the present invention. Subsequently, an insulation film 107 is buried between the MOS transistors 105. Thereafter, a metal line 110 including a barrier metal layer 108 and a conductive layer 109 is formed over the MOS transistor 105 and the insulation film 107.

Figure 2B:
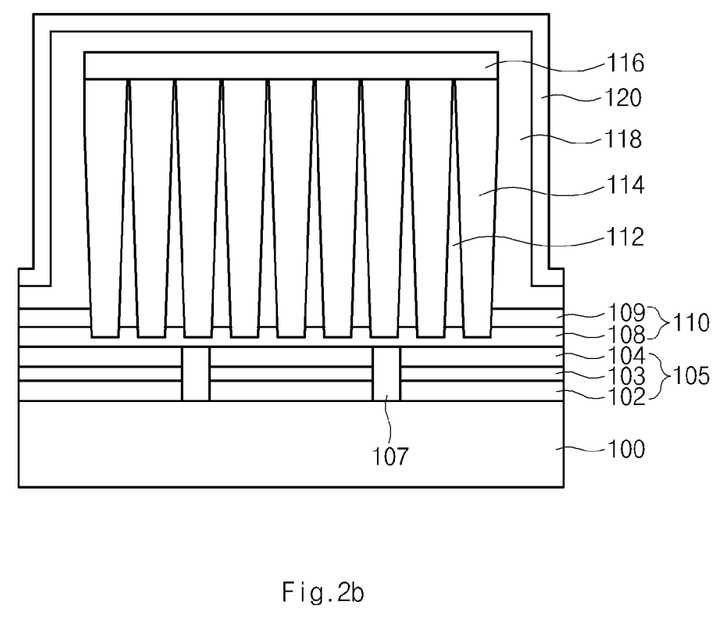

Referring to FIG. 2b, after an insulation film 112 is formed over the metal line 110 in the pad region, the insulation film 112 is etched to define a storage node region. Subsequently, a conductive layer is formed in the storage node region, so that a storage node 114 of the pad region can be formed. Although the storage node 114 in the pad region is generally deposited along a surface of the storage node region, the storage node 114 for use in this embodiment completely fills an inside of the storage node region for convenience of description and better understanding of the present invention. In an embodiment, the storage node 114 of the pad region may be formed simultaneously when the storage node of a cell region (not shown) is formed. Since an additional process for forming the storage node 114 in the pad region may be omitted, a process time may be reduced and the storage node 114 can be easily formed. In order to prevent leaning of the storage node 114 of the pad region, a support film 116 may further be formed over the storage node 114 in the pad region. Subsequently, a dielectric film 118 and an upper electrode 120 are formed over the storage node 114 and the support film 116.

A capacitor configured to include the storage node 114, the dielectric film 118 and the upper electrode 120 in the pad region is used as a first buffer layer for reducing a stress generated when a wire is bonded to the pad in a pad open portion 158 (see FIG. 2h), so that a stress transferred and applied to a lower structure including a MOS transistor and a specific circuit in the pad and peripheral regions is reduced. As a result, the capacitor acting as the first buffer layer can prevent formation of electric bridging between the pad region and the peripheral region.

In order to explain patterns formed in the pad region (i) and the peripheral region (ii), how the patterns in the pad region (i) and the peripheral region (ii) are formed will hereinafter be described.

Figure 2C:
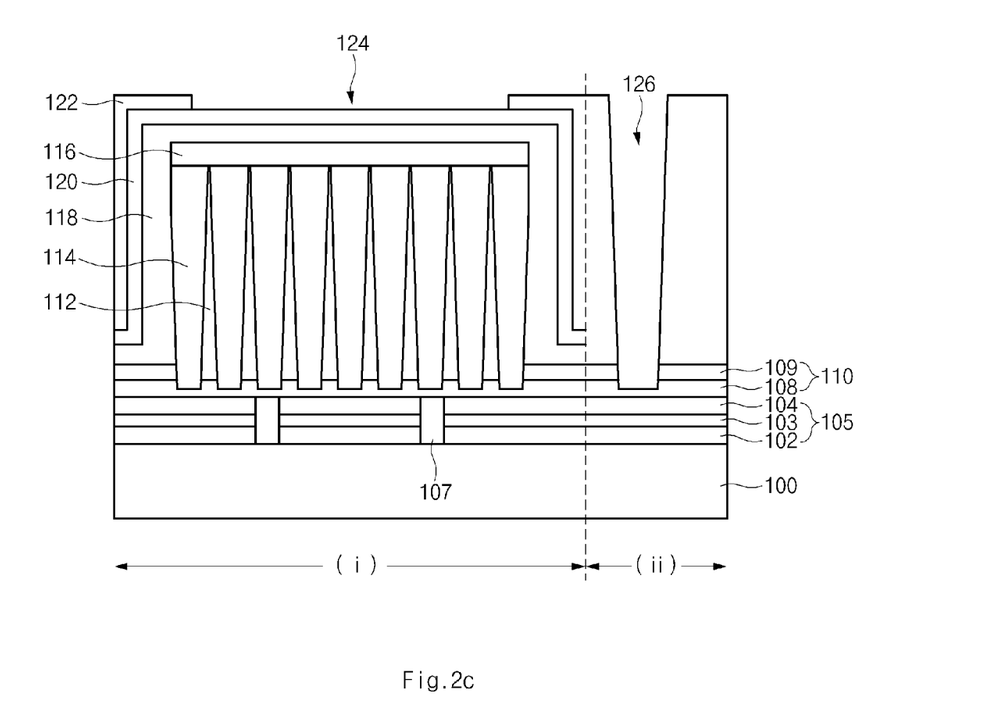

Referring to FIG. 2c, an insulation film 122 is formed over the entire surface including the pad region (i) and the peripheral region (ii). Subsequently, the insulation film 122 is etched to expose a portion of the upper electrode 120 in the pad region (i), so that a first pad trench 124 is formed. At the same time a metal contact hole 126 exposing a surface of the metal line 110 in the peripheral region (ii) is formed. In this case when the first pad trench 124 is formed simultaneously with the metal contact hole 126, a metal contact connected to the upper electrode 120 in the cell region (not shown) may also be formed.

Figure 2D:
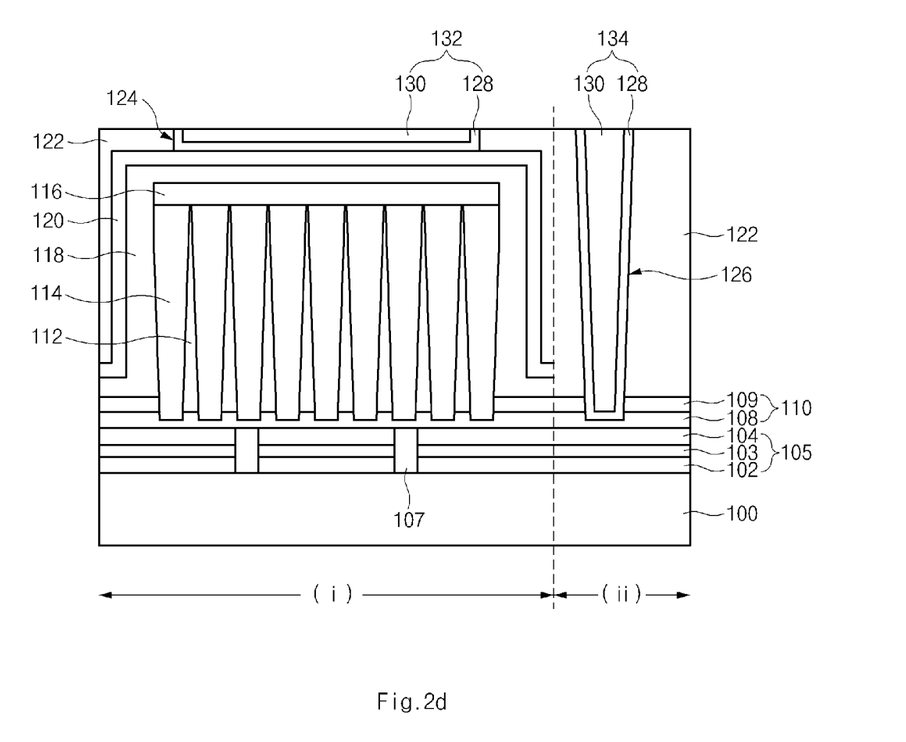

Referring to FIG. 2d, after a barrier metal layer 128 is formed over the first pad trench 124 in the pad region (i) and the metal contact hole 126 in the peripheral region (ii), a conductive material 130 is formed to fill the first pad trench 124 and the metal contact hole 126. As a result, a first contact pad 132 is formed in the pad region (i) and a first metal contact 134 is formed in the peripheral region (ii). For example, the barrier metal layer 128 may include a titanium (Ti) film or a titanium nitride (TiN) film, and the conductive material 130 may include tungsten (W).

In this case, the first contact pad 132 may serve as a second buffer layer that reduces a stress generated when the wire is bonded to the pad in the pad open portion 158 (see FIG. 2h), so that a stress applied to the lower structure including the MOS transistor and the circuit is reduced. As a result, the first contact pad 132 acting as the second buffer layer can prevent formation of electric bridging between the pad region (i) and the peripheral region (ii).

Figure 2E:
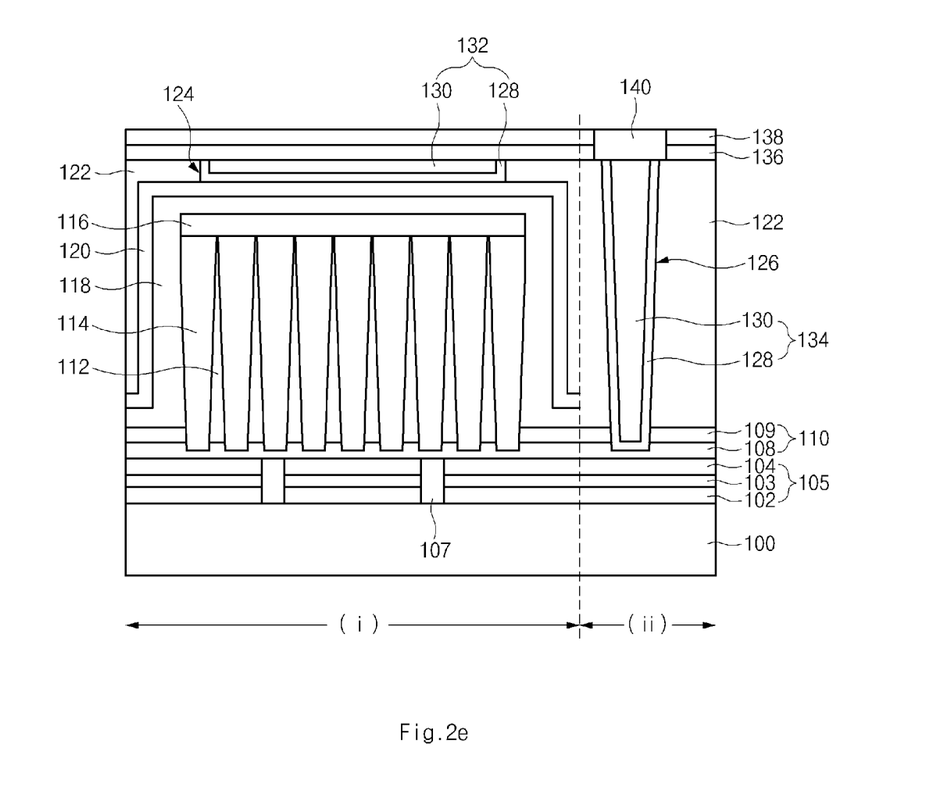

Referring to FIG. 2e, insulation films 136 and 138 are formed over the insulation film 122, the first contact pad 132, and the first metal contact 134. For example, the insulation film 136 may include a nitride film and the insulation film 138 may include an oxide film, because a metal line 140 connected to the first metal contact 134 is formed by a damascene process. In the damascene process, the insulation films 136 and 138 are etched to expose the first metal contact 134, resulting in formation of a trench. Then, a metal layer is filled in the trench so that the metal line 140 is formed. In an embodiment, the metal line 140 may include a copper (Cu) line.

Figure 2F:
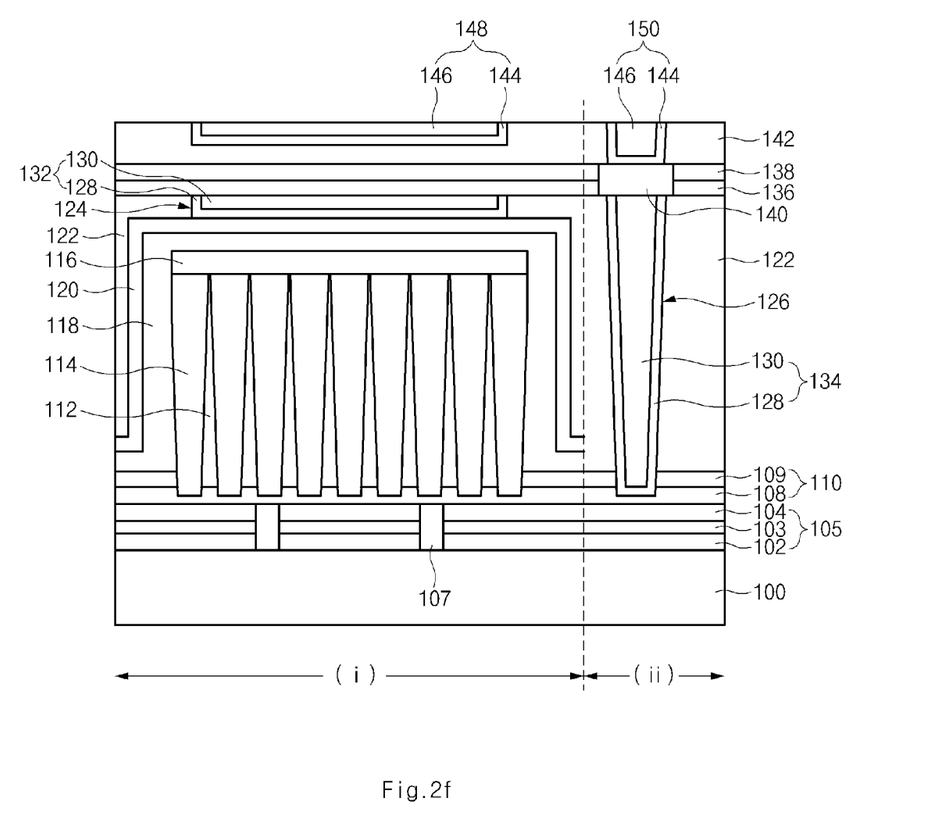

Referring to FIG. 2f, an insulation film 142 is formed over the insulation film 138 and the metal line 140. For example, the insulation film 142 may include a TEOS. Subsequently, some parts of the insulation film 142 in the pad region (i) and the peripheral region (ii) are etched to form a second pad trench and a metal contact hole, respectively. After a barrier metal layer 144 is formed in the second pad trench and the metal contact hole, a conductive material 146 is formed to fill the second pad trench and the metal contact hole. As a result, a second contact pad 148 is formed in the pad region (i) and a second metal contact 150 is formed in the peripheral region (ii). For example, the barrier metal layer 144 may include a titanium (Ti) film or a titanium nitride (TiN) film, and the conductive material 146 may include tungsten (W).

In this case, the second contact pad 148 may serve as a third buffer layer that reduces a stress generated when the wire is bonded to the pad in the pad open portion 158 (see FIG. 2h), so that a stress applied to the lower structure including the MOS transistor and the circuit is reduced. As a result, the second contact pad 148 acting as the third buffer layer can prevent forming of electric bridging between the pad region (i) and the peripheral region (ii).

Figure 2G:
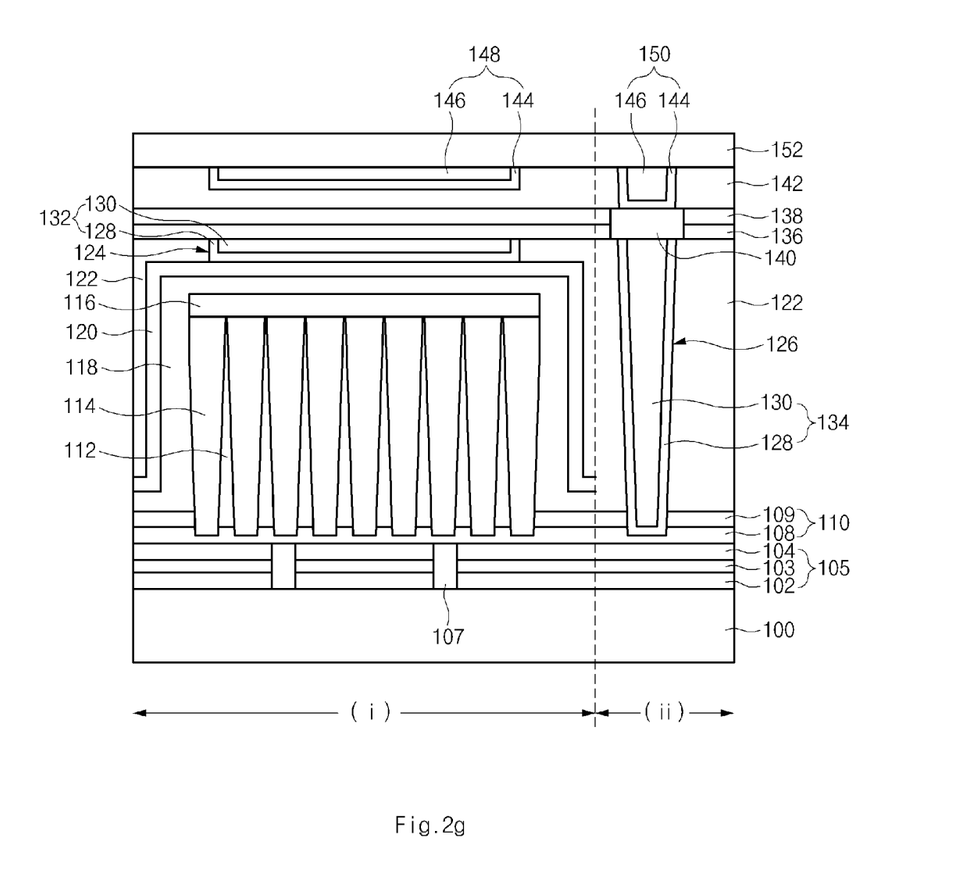

Referring to FIG. 2g, a metal pad 152 is formed over the insulation film 142, the second contact pad 148 and the second metal contact 150. For example, the metal pad 152 may include aluminum (Al).

Figure 2H:
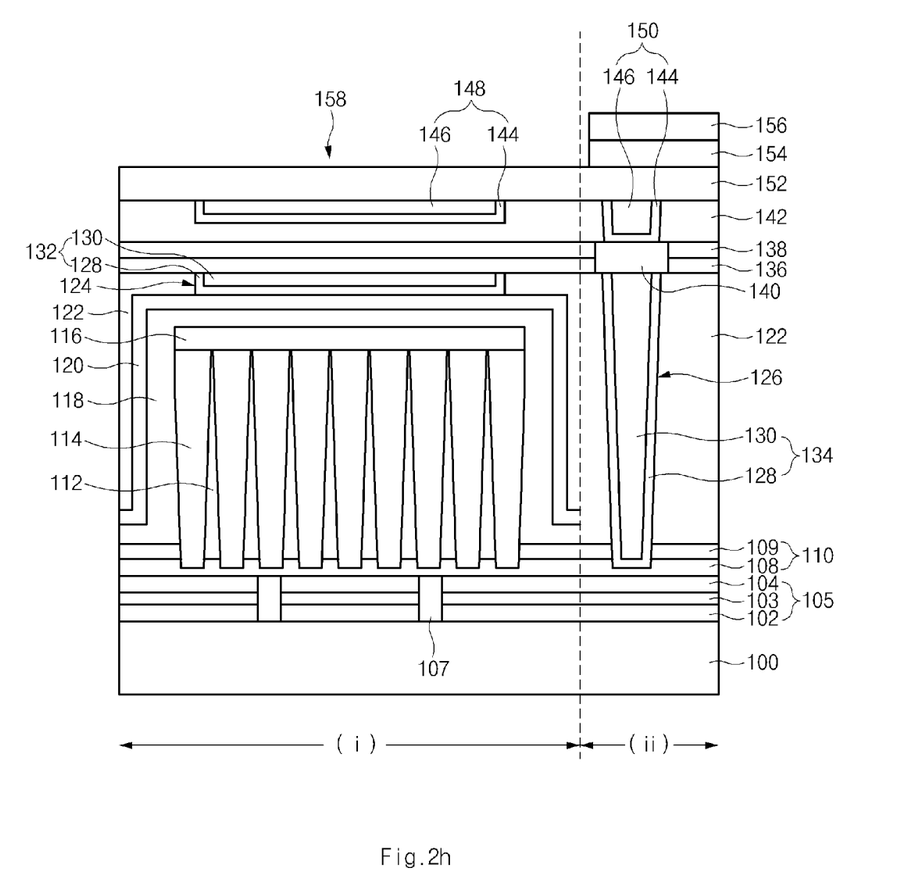

Referring to FIG. 2h, after passivation layers 154 and 156 are formed over the metal pad 152, the passivation layers 154 and 156 in the pad region (i) are etched to define the pad open portion 158 by exposing the metal pad 152. In this case, the passivation layer 154 may be formed by a high density plasma (HDP) deposition method, and the passivation layer 156 may include a nitride film.

The semiconductor device and the method for forming the same according to an embodiment reduces a stress generated when a wire is bonded to the pad metal in the pad open portion 158. As a result, a stress applied to a lower MOS transistor in the pad region (i) is reduced by using the storage node 114 and the upper electrode 116 serving as the first buffer layer, the first contact pad 132 serving as the second buffer layer, and the second contact pad 148 serving as the third buffer layer. In this manner, formation of electric bridging between the pad region (i) and the peripheral region (ii) is prevented.

As is apparent from the above description, the semiconductor device and the method for forming the same according to an embodiment form a plurality of buffer layer at a lower part in the pad region (i). The additional buffer layer reduces the stress caused by the wire bonding, so that the applied stress to the lower structure. As a result, the additional buffer layer prevents forming of an electrical bridge between the pad region (i) and the peripheral region (ii).

Those skilled in the art will appreciate that embodiments may be carried out in other specific ways than those set forth herein without departing from the spirit and characteristics of the above-described embodiments. These embodiments are therefore to be construed as being illustrative and not restrictive.

The above-described embodiments are illustrative and not restrictive. Various alternatives and equivalents are possible. These embodiments are not limited by a type of deposition, etching, polishing, and patterning processes described herein. Nor are these embodiments limited to any specific type of semiconductor device. For example, the above-described embodiments may be implemented in a dynamic random access memory (DRAM) device or a non-volatile memory device.

What is claimed is:

1. A semiconductor device comprising:
a semiconductor substrate including a pad region and a peripheral region;
a first buffer layer formed to include a capacitor over the semiconductor substrate in the pad region;
a second buffer layer formed to include a first contact pad over the first buffer layer;
a third buffer layer formed to include a second contact pad over the first contact pad; and
a metal-oxide-semiconductor (MOS) transistor formed below the first buffer layer, and formed over the semiconductor substrate in the pad region,
wherein the capacitor includes a storage node array, a support film formed over the storage node array, a dielectric film capping the storage node array and the support film, and an upper electrode capping the dielectric film.

2. The semiconductor device according to claim 1, wherein the MOS transistor includes a laminate structure of a polysilicon layer, a metal layer, and a hard mask layer.

3. The semiconductor device according to claim 1, further comprising:
a first metal line formed over the MOS transistor.

4. The semiconductor device according to claim 3, further comprising:
a first metal contact formed over the first metal line in the peripheral region.

5. The semiconductor device according to claim 3, wherein the first buffer layer is formed over the first metal line.

6. The semiconductor device according to claim 1, wherein the first contact pad includes tungsten.

7. The semiconductor device according to claim 4, wherein a top surface of the first contact pad is formed approximately at a same level as a top surface of the first metal contact.

8. The semiconductor device according to claim 4, further comprising:
a second metal line formed over the first metal contact in the peripheral region.

9. The semiconductor device according to claim 8, wherein the second metal line includes a copper (Cu) line.

10. The semiconductor device according to claim 8, further comprising:
a second metal contact formed over the second metal line in the peripheral region.

11. The semiconductor device according to claim 1, wherein the second contact pad includes tungsten.

12. The semiconductor device according to claim 10, wherein a top surface of the second contact pad is formed approximately at a same level as a top surface of the second metal contact.

13. The semiconductor device according to claim 1, wherein the first contact pad and the second contact pad are spaced apart from each other by an insulation film.

14. The semiconductor device according to claim 13, further comprising:
a metal pad formed over the insulation film in the pad region and the peripheral region.

15. The semiconductor device according to claim 14, wherein the metal pad includes aluminum.

16. The semiconductor device according to claim 14, further comprising:
a pad open portion including a portion of the metal pad in the pad region and defined by a passivation layer formed over the metal pad in the peripheral region.

17. The semiconductor device according to claim 1, wherein the storage node array includes a plurality of storage node members, and wherein a bottom surface of the support film contacts top surfaces of the plurality of storage node members, the bottom surface of the support film being a planar surface.

* * * * *